(12) United States Patent
Tumminaro et al.

(10) Patent No.: US 12,294,302 B2
(45) Date of Patent: May 6, 2025

(54) REGULATOR CIRCUIT, CORRESPONDING SYSTEM AND METHOD

(71) Applicant: STMICROELECTRONICS S.r.l., Agrate Brianza (IT)

(72) Inventors: Salvatore Tumminaro, Marianopoli (IT); Alfio Pasqua, Piedimonte Etneo (IT); Marco Sammartano, Petrosino (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 98 days.

(21) Appl. No.: 18/458,940

(22) Filed: Aug. 30, 2023

(65) Prior Publication Data

US 2023/0412080 A1 Dec. 21, 2023

Related U.S. Application Data

(63) Continuation of application No. 17/588,065, filed on Jan. 28, 2022, now Pat. No. 11,791,728.

(30) Foreign Application Priority Data

Feb. 9, 2021 (IT) .......................... 102021000002798

(51) Int. Cl.
 *H02M 3/158* (2006.01)
 *G05F 1/44* (2006.01)
(52) U.S. Cl.
 CPC .............. *H02M 3/158* (2013.01); *G05F 1/44* (2013.01)
(58) Field of Classification Search
 CPC .................................................... H02M 3/158

USPC ......................................................... 327/535
See application file for complete search history.

(56) References Cited

U.S. PATENT DOCUMENTS

| | | |
|---|---|---|
| 9,742,262 B1 | 8/2017 | Jutras |
| 2005/0286200 A1* | 12/2005 | Ohshima ............ H03K 17/0822 361/160 |
| 2009/0179691 A1 | 7/2009 | Tanzawa |
| 2011/0316509 A1 | 12/2011 | Chen |
| 2013/0148456 A1* | 6/2013 | Cho ....................... G11C 5/145 365/226 |
| 2017/0163146 A1* | 6/2017 | Suzuki ..................... H02M 3/07 |
| 2020/0076190 A1 | 3/2020 | La Rosa et al. |

* cited by examiner

*Primary Examiner* — Tomi Skibinski
(74) *Attorney, Agent, or Firm* — Seed IP Law Group LLP

(57) ABSTRACT

A circuit includes an electronic switch configured to be coupled intermediate a high-voltage node and low-voltage circuitry and configured to couple the low-voltage circuitry to the high-voltage node. A voltage-sensing node is configured to be coupled to the high-voltage node via a pull-up resistor. A further electronic switch can be switched to a conductive state to couple the voltage-sensing node and the control node of the electronic switch. A comparator compares a threshold with a voltage at the voltage-sensing node and causes the further electronic switch to switch on in response to the voltage at said voltage-sensing node reaching said threshold. A charge pump coupled to the current flow-path of the electronic switch is activated to the conductive state to pump electric charge from the current flow-path of the electronic switch to the control node of the electronic switch via the further electronic switch switched to the conductive state.

20 Claims, 5 Drawing Sheets

REGULATOR CIRCUIT, CORRESPONDING SYSTEM AND METHOD

BACKGROUND

Technical Field

The description relates to regulator circuits.

One or more embodiments can be applied to driving bypass field-effect transistors in high-voltage startup regulators as used in a variety of products.

These products may include, for instance, chargers/adapters, home appliances such as refrigerators or TVs, industrial machinery, telecom apparatus and so on.

Description of the Related Art

Regulator circuits such as high-voltage startup (HVS) regulators may include a bypass transistor (a MOSFET transistor, for instance), a pull-up resistor used to bias the gate of the bypass transistor, as well as a voltage clamp connected between the gate of the bypass transistor and ground in order to limit the gate voltage range and define a maximum supply voltage output.

Such an approach may exhibit certain limitations in terms of power consumption, application input range, and cost.

For instance, in low-power applications, a constraint may be placed on the lowest (minimum) resistance value for the pull-up resistor.

Under those circumstances, achieving a trade-off between such a constraint on the minimum resistance value for the pull-up resistor and the lowest (minimum) high-voltage input may become critical, while on the other hand a bypass component with a gate bias current still represents an attractive, cost-effective solution.

BRIEF SUMMARY

One or more embodiments of the present disclosure contribute in addressing the issues discussed in the foregoing.

According to one or more embodiments, such technical features or benefits can be achieved by a circuit as will be described in further detail herein.

One or more embodiments may relate to a corresponding system. A switched-mode power supply (SMPS) system may be exemplary of such a system.

One or more embodiments may relate to a corresponding method.

One or more embodiments may provide a cost-effective solution, primarily in comparison with the use of a dedicated HV-MOS with no gate leakage.

One or more embodiments may use a charge pump to sustain the gate leakage current. Such a charge pump can be supplied by a transistor source and its activation may thus involve pulling-up the gate of the bypass transistor.

In one or more embodiments, an (electronic) switch may be interposed between the gate and the pull-up resistor.

The switch can be closed (that is, made conductive) by a latched comparator in response to the input voltage reaching (that is, rising up to) a comparator threshold.

The charge stored in a capacitor intermediate (between) the pull-up resistor (RHV) and ground facilitates pulling-up the gate with the capability of providing both supply energy as consumed by the comparator/latch and supporting gate leakage, before charge pump turn-on.

One or more embodiments can effectively address certain limitations in terms of power consumption, application input range, and cost.

The possible presence of an embedded charge pump may result in a negative current detected on a high-voltage pin when the high voltage startup regulator is active.

In at least one embodiment, a circuit is provided that includes a first electronic switch having a current flow path therethrough. The first electronic switch is configured to be coupled between a high-voltage node and low-voltage circuitry. The first electronic switch has a control node configured to switch the first electronic switch to a conductive state in which the first electronic switch electrically couples the low-voltage circuitry to the high-voltage node. A voltage-sensing node is configured to be coupled to the high-voltage node via a pull-up resistor. A second electronic switch is coupled between the voltage-sensing node and the control node of the first electronic switch. The second electronic switch is switchable to a conductive state in which the second electronic switch electrically couples the voltage-sensing node to the control node of the first electronic switch in response to receiving a switch-on signal. A comparator is coupled to the voltage-sensing node and a threshold. The comparator is configured to compare a voltage at the voltage-sensing node with the threshold and generate the switch-on signal in response to the voltage at the voltage-sensing node reaching the threshold. A charge pump is coupled to the current flow-path of the first electronic switch and configured to be activated with the second electronic switch switched to the conductive state to pump electric charge from the current flow-path of the first electronic switch to the control node of the first electronic switch via the second electronic switch switched to the conductive state.

In at least one embodiment, a power supply system is provided that includes a high-voltage source, low-voltage circuitry, and a circuit. The circuit includes a high-voltage node coupled to the high-voltage source. A first electronic switch has a current flow path therethrough, and the first electronic switch is coupled between the high-voltage node and low-voltage circuitry. The first electronic switch has a control node configured to switch the first electronic switch to a conductive state in which the first electronic switch electrically couple the low-voltage circuitry to the high-voltage node. A pull-up resistor is coupled between a voltage-sensing node and the high-voltage node. A second electronic switch is coupled between the voltage-sensing node and the control node of the first electronic switch, and the second electronic switch is switchable to a conductive state in which the second electronic switch electrically couples the voltage-sensing node to the control node of the first electronic switch in response to receiving a switch-on signal. A comparator is coupled to the voltage-sensing node and a threshold, and the comparator is configured to compare a voltage at the voltage-sensing node with the threshold and generate the switch-on signal in response to the voltage at said voltage-sensing node reaching said threshold. A charge pump is coupled to the current flow-path of the first electronic switch and configured to be activated with the second electronic switch switched to the conductive state to pump electric charge from the current flow-path of the first electronic switch to the control node of the first electronic switch via the second electronic switch switched to the conductive state.

In at least one embodiment, a method is provided that includes: coupling a first electronic switch between a high-voltage source and low-voltage circuitry, the first electronic switch having a current flow path therethrough and a control node; electrically coupling the low-voltage circuitry to the high-voltage source by switching the first electronic switch to a conductive state via the control node; coupling a voltage-sensing node to the high-voltage source via a pull-up resistor; coupling a second electronic switch between the voltage-sensing node and the control node of the first electronic switch; coupling the voltage-sensing node to the control node of the first electronic switch by switching the second electronic switch to a conductive state in response to the voltage at said voltage-sensing node reaching a threshold; coupling a charge pump to the current flow-path of the first electronic switch; and activating the charge pump with the second electronic switch switched to the conductive state to pump electric charge from the current flow-path of the first electronic switch to the control node of the first electronic switch via the second electronic switch switched to the conductive state.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

Figure 1:
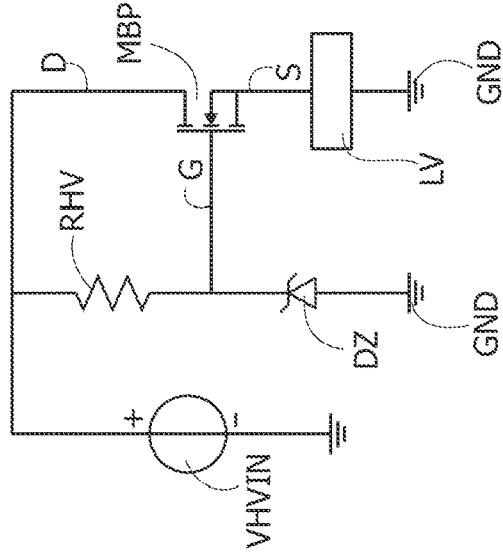
FIG. 1 is a block diagram exemplary of a high-voltage startup (HVS) regulator.

By way of introduction to the instant detailed description, reference may be had to FIG. 1, which reproduces a circuit diagram of a conventional high-voltage startup (HVS) regulator designated 10 as a whole.

Such a regulator is intended to provide a low voltage supply to a low-voltage section LV from a high voltage source VHVIN. It is noted that in various types of high-voltage power converters, such a high-voltage startup regulator may be used only during a power-on phase to be subsequently replaced by a more efficient supply source.

A high-voltage startup regulator 10 as illustrated in FIG. 1 comprises a "bypass" electronic switch MBP (a MOSFET transistor, for instance) able to withstand a high voltage applied across it.

In that respect, those of skill in the art will appreciate that a MOSFET transistor is referred to herein as the switch MBP merely by way of example: other types of electronic switches (for instance, JFET, BJT, GaN) may be used as the switch MBP.

As illustrated in FIG. 1, the switch MBP is arranged with the current path therethrough (source-drain, in the case of a field-effect transistor such as a MOSFET) coupled intermediate an input node to which a high voltage VHVIN can be applied and the low-voltage section LV, which can be assumed to be referred to ground GND.

As illustrated in FIG. 1, the drain D of the MOSFET transistor MBP is connected to the high-voltage input node at VHVIN while the source S of the MOSFET transistor MBP supplies the low-voltage circuitry LV.

A pull-up resistor RHV is used to bias the control node G (gate, in the case of a field-effect transistor such as a MOSFET) of the bypass switch MBP.

As illustrated, the pull-up resistor RHV is arranged between the high-voltage input node at VHVIN and the gate G of MBP.

A voltage clamp DZ (a Zener diode, for instance) is arranged between the gate G of MBP and ground GND in order to limit the gate voltage range of MBP and define a highest (maximum) supply voltage for the low-voltage section LV.

In order to reach this voltage value, the input voltage is selected above the DZ voltage clamp.

In low-power applications, a constraint on the minimum value of the resistance of RHV is set in order to limit waste of power. Another specification is the lowest (minimum) input voltage ($VHVIN_{MIN}$) for which the high-voltage regulator is expected to be capable of supplying the downstream circuits.

Assuming MBP is a component having a gate bias current ($I_{GATE}$) a certain voltage drop on RHV may exist which establishes a judicious trade-off between the constraint on the minimum RHV and the minimum high-voltage input.

A problem arises when this trade-off cannot be satisfactorily reached.

For instance, with RHV=10 MSΩ and $I_{GATE}$=101 µA, the minimum input voltage is above 100V.

In principle, using a lower resistance value for RHV may be considered, to the point of even dispensing with such resistance. It is otherwise noted that the minimum value for that resistance is related to a desirably reduced stand-by consumption, which results in a design constraint.

Also, using a component "with leakage" may be an attractive option in monolithic or System in Package (SiP) arrangements: for instance, a high-voltage component with non-zero gate current may represent the only component available in a certain technological process and/or may represent an advantageous choice in view of specific design characteristics.

For instance, gallium-nitride (GaN) technology may be selected for the main switch in a converter in view of its improved static and dynamic performance in comparison with silicon-based power MOS transistors. Adding a dedicated component (a SIP with a dedicated die and/or process) may be more expensive and complex.

Using a bypass component MBP with a gate bias current $I_{GATE}$ forced to flow through RHV and then into the gate of MBP may provide a solution which is cost-effective and attractive (for instance, resulting in a monolithic solution with only one component available). Such an approach may otherwise exhibit various drawbacks: for instance, it may be hardly suited for use in very-low standby applications and/or may end up by providing undesirably expensive and complex solutions.

Figure 2:
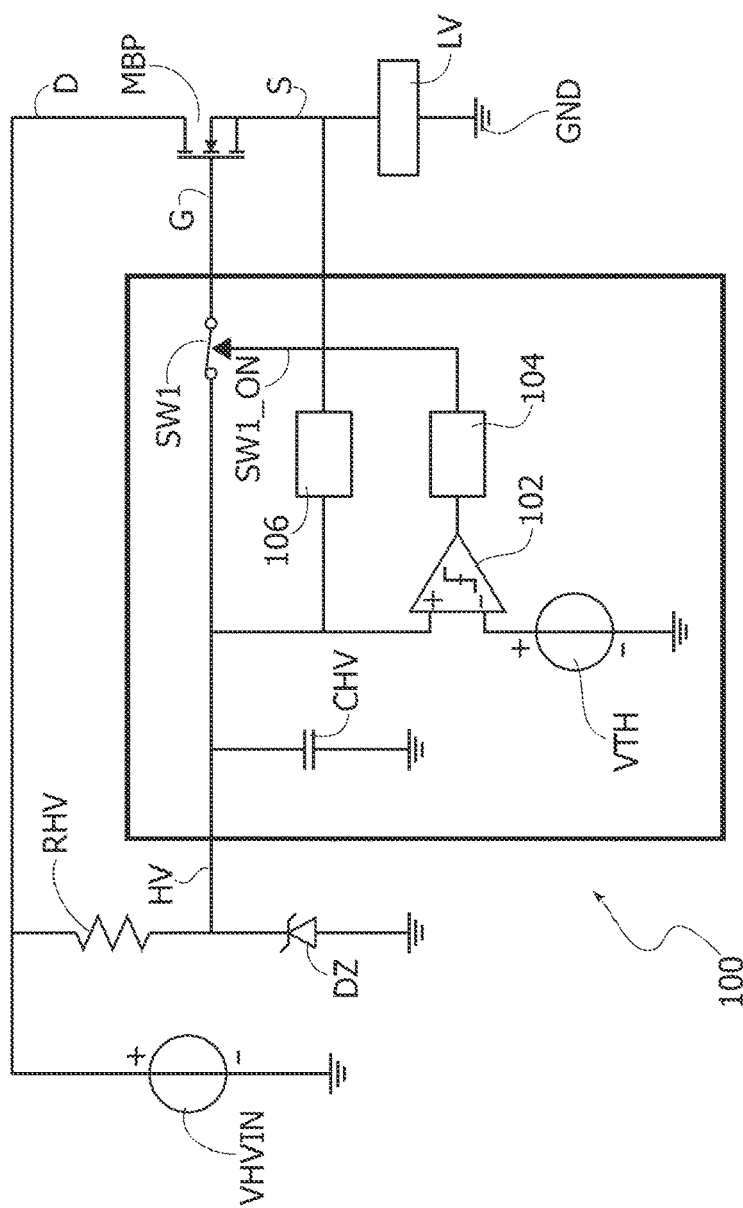
FIG. 2 is a block diagram of a high-voltage startup (HVS) regulator according to one or more embodiments of the present disclosure.

One or more embodiments may address these issues adopting the approach illustrated in FIG. 2.

In that respect, it will be appreciated that:
unless the context indicates otherwise, like parts or elements are indicated throughout the annexed figures with like reference symbols, and a detailed description will not be repeated for each and every figure for brevity; consequently, parts or elements already discussed in connection with FIG. 1 are indicated throughout the annexed figures with like reference symbols and will not be not discussed again;
for the sake of simplicity and ease of understanding, a same designation may be used herein to indicate both a node or line in a circuit and a signal (voltage, current, for instance) occurring at that node or line: see, for instance, VHVIN, as already introduced previously;
various components illustrated and discussed for ease of explanation (the source of the high-voltage VHVIN and the low-voltage circuitry LV, for instance) may be distinct elements from the embodiments.

In one or more embodiments as illustrated in FIG. 2, circuitry designated 100 as a whole is coupled intermediate:
a node HV intermediate the resistor RHV and the voltage clamp DZ, and the control node G (here, gate) of the switch MBP.

As illustrated, the circuitry 100 comprises an electronic switch SW1 (a MOSFET transistor, for instance) with the current path therethrough (source-drain, in the case of a field-effect transistor such as a MOSFET) configured to connect—in response to the switch SW1 being "on", that is, conductive—the control node G of the "main" switch MBP to the node HV, and thus to the pull-up resistor RHV.

As illustrated, the circuitry 100 also comprises:
a capacitor CHV interposed between the node HV and ground (that is, in parallel to the voltage clamp DZ;
a comparator 102 configured to sense the voltage at the node HV (that is, the voltage across the capacitor CHV) with a threshold VTH (generated in a manner known per se to those of skill in the art);
a latch circuit 104 configured to latch the output of the comparator 102 and to control via its output the status of the switch SW1; and
a charge pump 106 interposed between a node S (source, for instance, in the case of a field-effect transistor such as MOSFET) intermediate the switch MBP and the low-voltage section LV and the node HV, the charge pump 106 having the purpose of sustaining a bias current through the switch MBP while avoiding an undesired voltage drop on RHV.

Figure 3A:
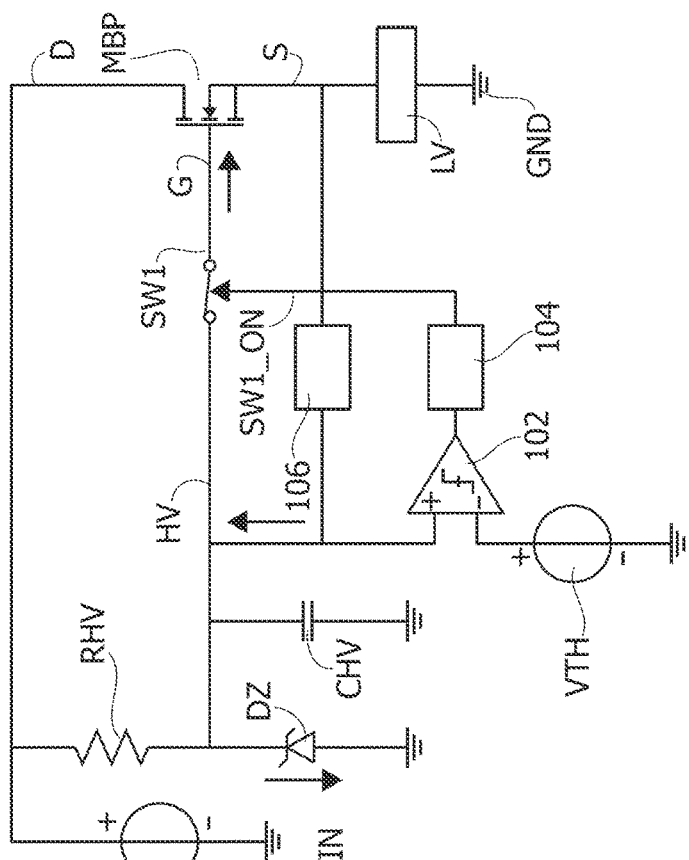
FIGS. 3A and 3B are block diagrams illustrating operation of a regulator as illustrated in FIG. 2.
Figure 3B:
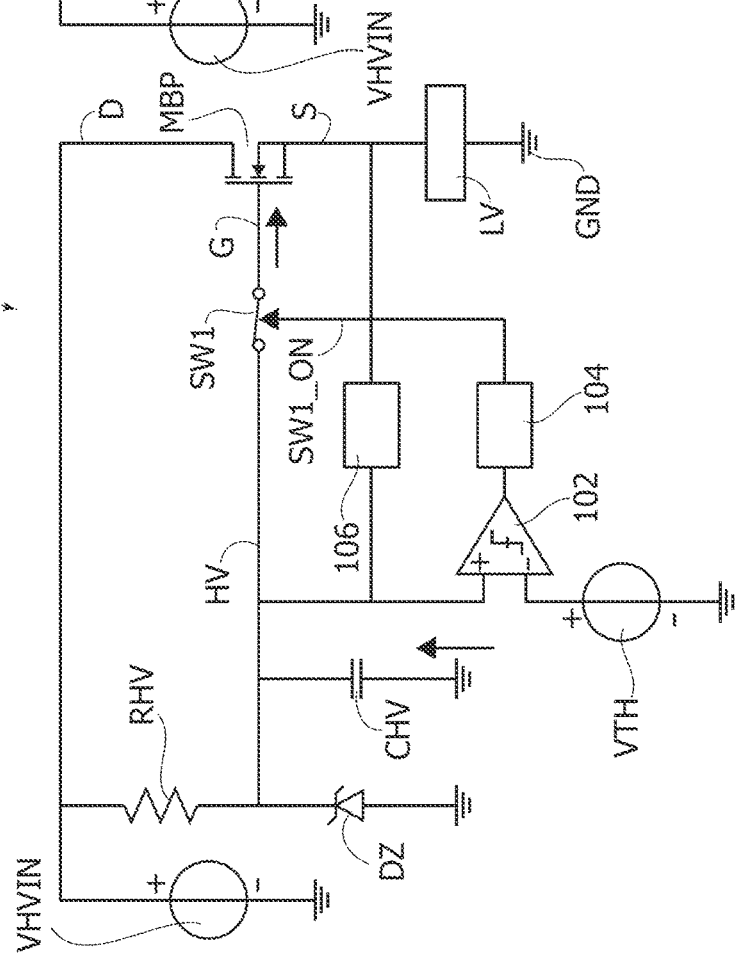

FIGS. 3A and 3B are exemplary of possible operation of a regulator 10 as exemplified in FIG. 2.

Once again, unless the context indicates otherwise, parts or elements already discussed in connection with FIGS. 1 and 2 are indicated in FIGS. 3A and 3B with like reference symbols and will not be not described again for brevity.

More specifically, FIGS. 3A and 3B are exemplary of possible current flows in a regulator 10 as per the embodiments exemplified in FIG. 2:
before the charge pump 106 is turned on (FIG. 3A),
after the charge pump 106 is turned on (FIG. 3B).

At power-on, SW1 is assumed to be open (non-conductive) and no current $I_{GATE}$ can flow through RHV towards the node G and the voltage at the node HV follows VHVIN.

In response to the voltage at the node HV reaching the threshold VTH of the comparator 102 (20 V, by way of example), the related information is stored by the latch 104 and SW1 is closed (that is, made conductive) via a signal SW1_ON being asserted.

In this phase the charging of the capacitor CHV is used to pull-up the gate G of the switch MBP (exploiting the intrinsic gate-source capacitance, for instance) and a current $I_{GATE}$ is provided towards the node G.

When the voltage on the source S of MBP is enough (that is, it exceeds a lower threshold as desired), the charge pump 106 starts to supply current towards the node HV, drawing current from the source S of MBP (see FIG. 3B).

The charge pump 106 thus provides the current $I_{GATE}$ and a current in excess of $I_{GATE}$ used to charge the capacitor CHV up to the voltage clamp of HV.

That is, during high-voltage regulator operation, the resistor RHV does not contribute appreciably to supplying the current $I_{GATE}$ and the voltage drop across RHV does not limit the lowest (minimum) input voltage, which is independent both of the resistance value of RHV value and of the intensity of $I_{GATE}$.

Figure 4:
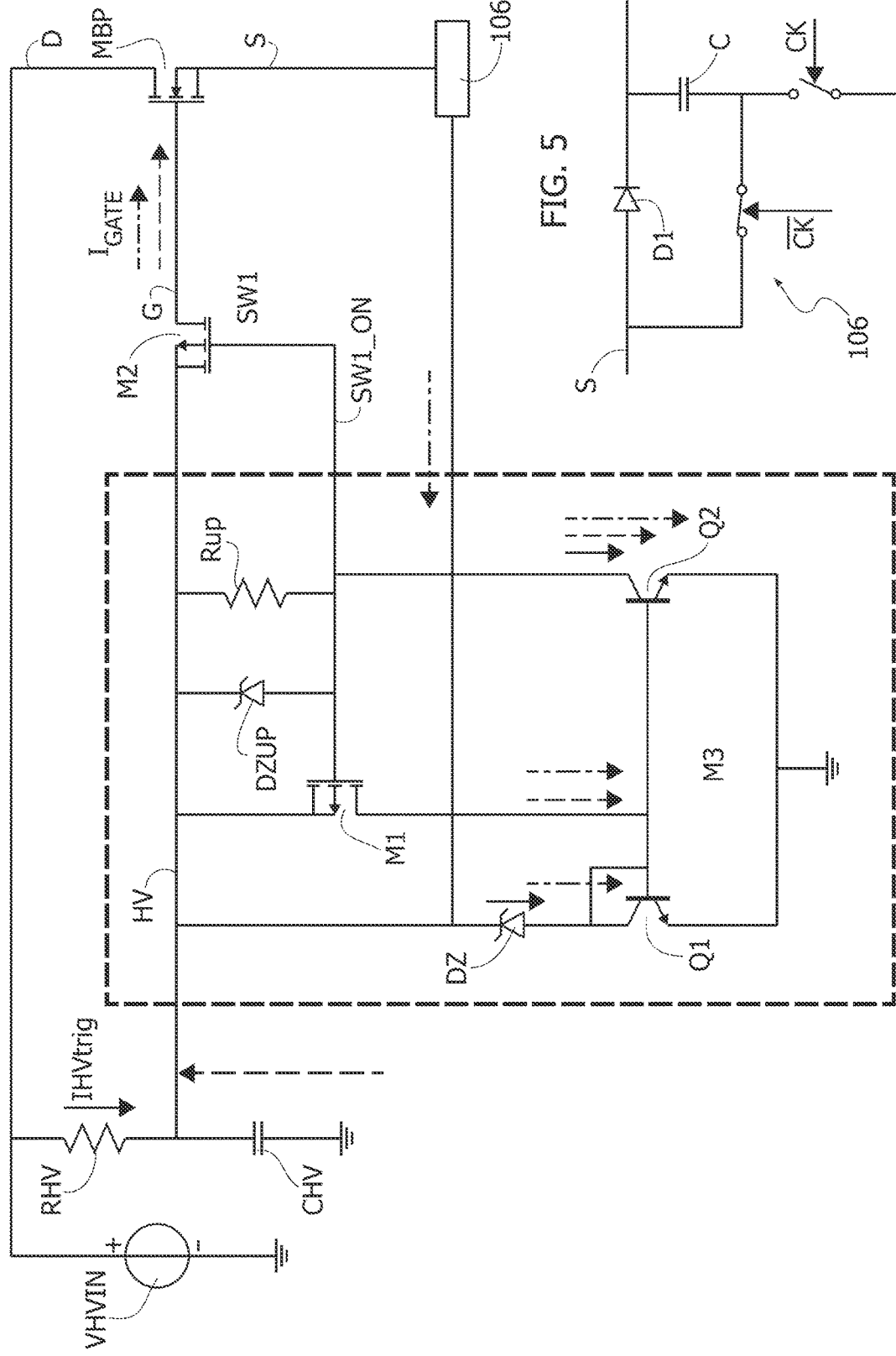
FIG. 4 is a transistor-level representation of one or more embodiments of the present disclosure.

FIG. 4 is a transistor-level diagram exemplary of a of a possible embodiment of the layout illustrated in FIG. 2 based on a latched current comparator 1024, which is configured to facilitate having a current IHVtrig through the resistor RHV such that IHVtrig<<<$I_{GATE}$.

Once again, unless the context indicates otherwise, parts or elements already discussed in connection with FIGS. 1, 2 and 3A and 3B are indicated in FIG. 4 with like reference symbols and will not be not described again for brevity.

Essentially, the latched comparator 1024 is based on a current mirror M3 including two transistors Q1 (in a diode-like configuration) and Q2 having current flow paths therethrough (emitter-collector, in the case of bipolar transistors as exemplified herein) that define respective current flow lines:
between the node HV and ground GND via the current clamp DZ (transistor Q1), and between the control node (gate) of the switch SW1 and ground GND (transistor Q2).

The mutually connected bases of the transistors Q1 and Q2 are coupled to the node HV via the current flow path (source-drain, in the case of a MOSFET transistor as exemplified herein) through a further electronic switch M1 whose control node (gate in the case of a MOSFET transistor as exemplified herein) is coupled to the control node of the switch SW1 vie the line where the switching signal SW1_ON is applied with the parallel connection of a further voltage clamp DZUP and further pull-up resistor Rup coupling that line with the line/node HV.

In FIG. 4, the main currents before start-up are indicated in continuous lines. Dashes lines denote main currents at startup and chain lines denote the main currents in steady state after activation of the charge pump 106.

Figure 5:
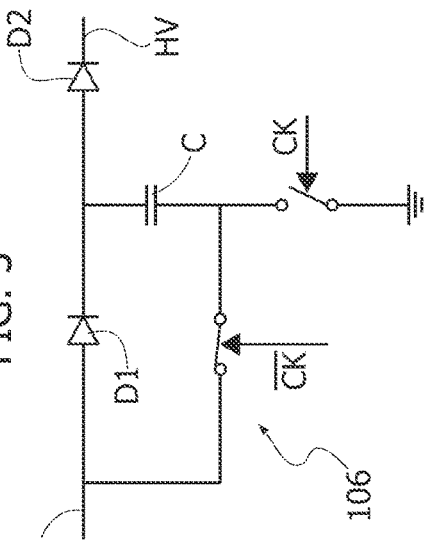
FIG. 5 is a circuit diagram illustrating implementation of a component (charge pump) illustrated in FIG. 4, in accordance with one or more embodiments.

The charge pump 106 can be of any conventional type, such as Dickson, for instance, as exemplified in FIG. 5.

Figure 6:
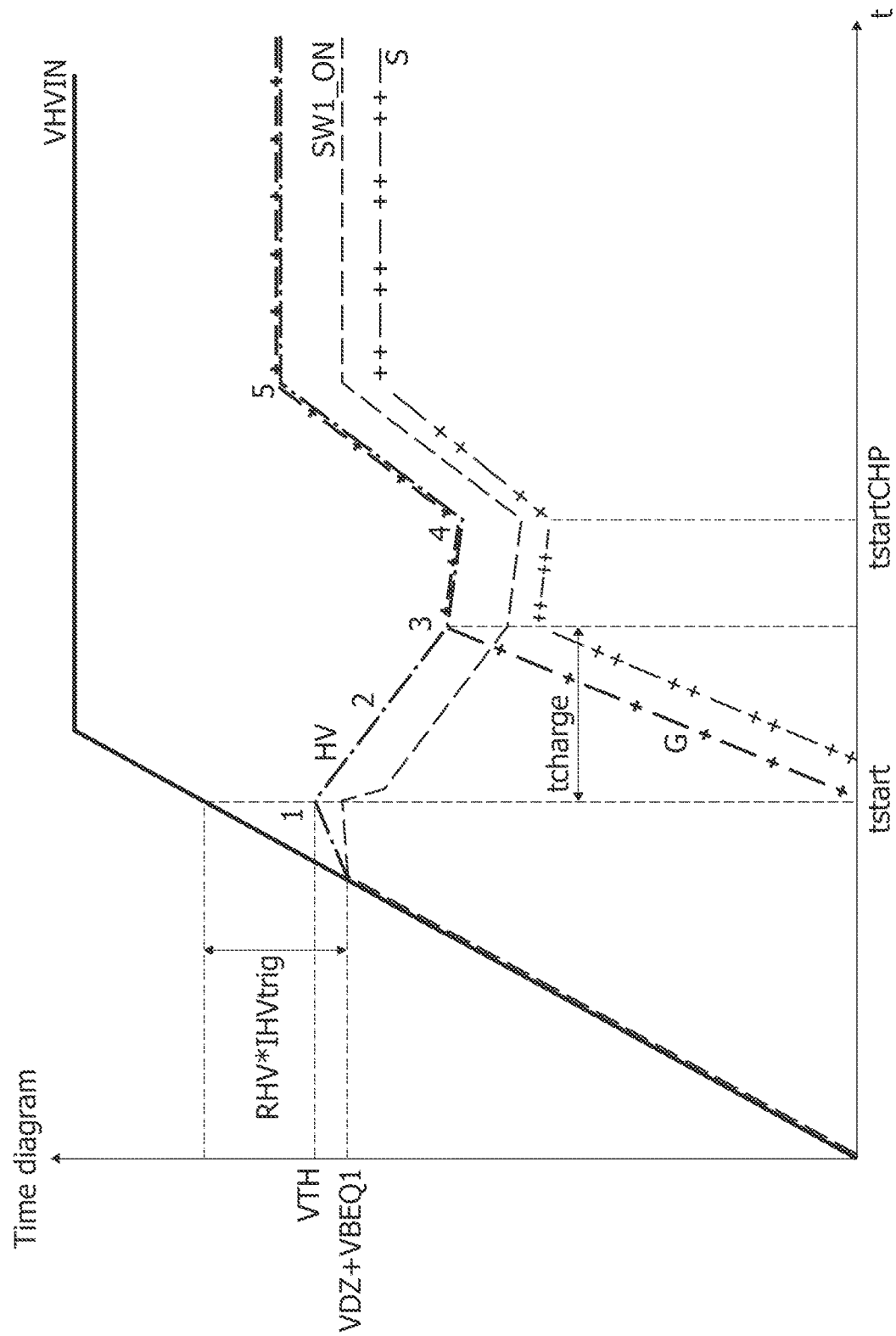
FIG. 6 is a set of time diagram illustrative of time behavior of particular signals which may occur in a regulator according to one or more embodiments.

FIG. 6 comprises a set time diagrams exemplary of possible time behaviors, mapped against a common time (abscissa) scale of the following signals:
- the "high" voltage VHVIN (continuous line)
- the signal SW1_ON (dashed line)
- the voltage at node HV (chain line)
- the voltage at node G (mixed dash and cross line--+--+, which finally superposes with the voltage at node HV
- the voltage S ((mixed dash and double-cross line--++--++--.

The diagrams of FIG. 6 are exemplary of a possible start-up sequence including events designated with numbers from 1 to 5 such as:
1—the node HV reaches the threshold VTH that triggers the closing of SW1 (at a time tstart);
2—the intrinsic capacitance at the node G is charged via charge sharing with the capacitance CHV;
3—charge sharing causes a voltage drop on the node HV until the voltage at that node equals the voltage on the G node (at a time tcharge after tstart);
4—the S node follows the node G with a voltage drop therebetween close to the threshold of MBP and MBP starts supplying the charge pump 106 (time tstartCHP);
the charge pump 106 re-charges the capacitor CHV up to the voltage clamp.

Figure 7:
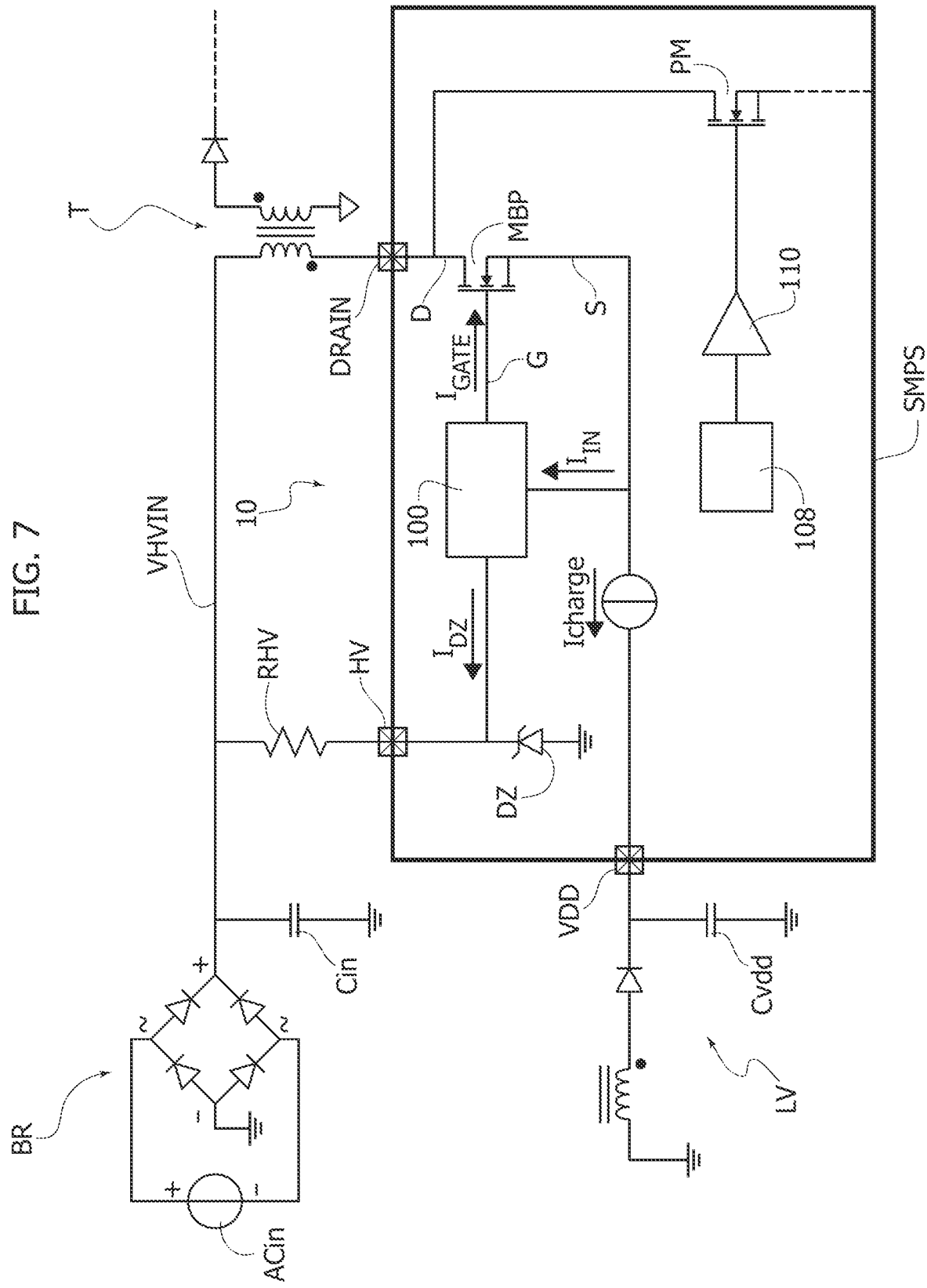
FIG. 7 is a circuit diagram illustrating use of a regulator according to one or more embodiments within the framework of a switched-mode power supply system.

FIG. 7 is a circuit diagram exemplary of the possible use of circuit 10 as discussed in the foregoing within the framework of a switched-mode power supply (that is an electronic power supply system that incorporates a switching regulator to convert electrical power efficiently).

Once again, unless the context indicates otherwise, parts or elements already discussed in connection with the previous figures are indicated in FIG. 7 with like reference symbols and will not be not described again for brevity.

FIG. 7 illustrates the possible use of embodiments in connection with a system in package (SIP) switched-mode power supply controller generally designated SMPS.

FIG. 7 exemplifies the possible use of embodiments in switching power controllers (with a flyback topology in the—purely exemplary—case illustrated) integrating a main power switch PM (a power MOSFET transistor, for instance), with part of the circuit 10 included in the controller (for instance the clamp DZ, the bypass FET driver 100, and the switch MBP) while other components (such as the resistor RHV) may be external parts distinct from the circuit 100 (and 10).

For instance, this may be the case of the source of the high-voltage VHVIN, represented in FIG. 7 by a bridge rectifier BR supplied by an AC source ACin (a mains distribution grid, for instance) and having associated therewith a smoothing capacitor Cin intended to be coupled with the line or node VHVIN.

In an arrangement as exemplified in FIG. 7, in the place of being coupled to VHVIN directly as discussed previously, the switch MBP is coupled to VHVIN (at its drain) indirectly, that is, via the primary winding of the converter transformer T.

In an arrangement as exemplified in FIG. 7, the low-voltage circuitry LV coupled to the switch MBP (here at the source) includes the supply portion of the SMPS controller, including a supply node VDD.

The external network coupled to the node VDD is exemplified as a winding driving a rectifier diode and a smoothing capacitor Cvdd (not to be confused with the capacitor CHV discussed previously), provides an auxiliary power supply active during regulation. A current generator Icharge is illustrated as exemplary of the node VDD being charged with a controlled current. The current generator could be replaced with a diode exemplary of the fact that the auxiliary power supply and the power supply from the HVS circuit are mutually decoupled.

The symbol PM in FIG. 7 denotes a main switch of the switching converter. Advantageously, this may be of the same type of switch MBP (a GaN transistor, for instance).

The reference 108 in FIG. 7 denotes the logic control circuitry of the switch PM, which applies to the switch a PWM-modulated control signal via a driver 110.

This may occur in any conventional manner known to those of skill in the art. It will be otherwise appreciated that FIG. 7 provides a fairly general representation of a switching controller: reference to a SMPS converter controller as made in FIG. 7 is thus merely exemplary and not limiting of the embodiments.

One or more embodiments may in fact be applied to flyback, boost topologies and other types of bypass regulators as a high-voltage startup current generator.

One or more embodiments may provide various advantages such as, for instance:
- power consumption is reduced,
- limits on the application input range are removed,
- a cost-effective solution is provided in comparison with the use of dedicated HV-MOS that has no gate leakage,
- gate leakage current flowing in the resistor RHV at power-on is avoided via the switch SW1,
- the comparator and latch circuitry (that is 102, 104, 1024) exhibits a low consumption before the switch SW1 is turned-on,
- a simple charge pump circuit is used to sustain bypass FET gate leakage.

Briefly, one or more embodiments remove a limitation of conventional high-voltage startup regulators employing as a bypass component an electronic switch having a (high) bias current.

In that respect, it is again noted that, while a MOSFET transistor has been referred throughout as exemplary of the switch MBP, other types of electronic switches (for instance, JFET, BJT, GaN) may be used for the same purposes.

Such a limitation is related to the voltage drop on a pull-up resistor (RHV, for instance) having one end used to bias the bypass switch gate such a resistor and other end connected at the main input voltage.

One or more embodiments use a charge pump in order to sustain the gate leakage current.

Such a charge pump can be supplied by the transistor source and its activation involves pulling-up the gate of the bypass switch MBP.

In one or more embodiments an electronic switch SW1 is interposed between the control node (gate, for instance) of the bypass switch MBP gate and the pull-up resistor. The switch is closed (by a latched comparator, for instance) as soon as the input voltage reaches a comparator threshold.

The charge stored in a capacitor (CHV, for instance) connected between RHV and GND facilitates gate pull-up with the capability of supplying (and sustaining) both the consumption of the comparator/latch consumption and gate leakage, before the charge pump turning-on.

Briefly, a circuit (for instance, 10) as exemplified herein may comprise:
- an electronic switch (for instance, MBP) having a current flow path (for instance, S, D) therethrough, the electronic switch configured to be coupled intermediate a high-voltage node (for instance, VHVIN) and low-voltage circuitry (for instance, LV), the electronic switch having a control node (for instance, G) configured to switch the electronic switch to a conductive state wherein the low-voltage circuitry is coupled to the high-voltage node.

A circuit as exemplified herein may further comprise a voltage-sensing node (for instance, HV) configured to be coupled to the high-voltage node via a pull-up resistor (for instance, RHV),
  a further electronic switch (for instance, SW1) intermediate the voltage-sensing node and the control node of the electronic switch, the further electronic switch switchable to a conductive state to couple the voltage-sensing node and the control node of the electronic switch in response to a switch-on signal (for instance, SW1_ON) being asserted,
  a comparator (for instance, 102) coupled to the voltage-sensing node and a threshold, the comparator configured to compare a voltage at said voltage-sensing node with the threshold and cause the switch-on signal to be asserted in response to the voltage at said voltage-sensing node reaching said threshold, and
  a charge pump (for instance, 106) coupled to the current flow-path of the electronic switch and configured to be activated with the further electronic switch switched to the conductive state to pump electric charge (for instance, $I_{GATE}$) from the current flow-path of the electronic switch to the control node of the electronic switch via the further electronic switch switched to the conductive state.

A circuit as exemplified herein may comprise a charge capacitor (for instance, CHV) coupled (for instance, via HV) to the charge pump to be charged thereby via charge in excess of the charge pumped to the control node of the electronic switch.

In a circuit as exemplified herein, the charge pump is coupled to the voltage-sensing node and configured to pump therein charge sourced from the current flow-path of the electronic switch.

A circuit as exemplified herein may comprise a latch circuit (for instance, 104) intermediate the comparator and the further electronic switch to latch therein said switch-on signal in response to the voltage at said voltage-sensing node reaching said threshold.

In a circuit as exemplified herein, the voltage-sensing node is configured to be coupled to the high-voltage node intermediate said pull-up resistor (for instance, RHV) and a voltage clamp (for instance, DZ) referred to ground (for instance, GND) configured to clamp to a limit value the voltage at the voltage-sensing node.

In a circuit as exemplified herein, the electronic switch (for instance, MBP) has a first node (for instance, D) configured to be coupled to the high-voltage node (for instance, VHVIN) and a second node (for instance, S) configured to be coupled to the low-voltage circuitry (for instance, LV), and wherein the charge pump is coupled to the current flow-path of the electronic switch at the second node (for instance, S).

In a circuit as exemplified herein, the electronic switch and the further electronic switch may comprise field-effect transistors, optionally MOSFET transistors.

A power supply system as exemplified herein may comprise:
  a high-voltage source (for instance, BR, Cin),
  a circuit as exemplified herein (for instance, 10) having said high-voltage node (for instance, VHVIN) coupled to the high-voltage source (for instance, BR, Cin), and low-voltage circuitry (for instance, LV) coupled (for instance, at S) to the electronic switch wherein the low-voltage circuitry is coupled to the high-voltage node in response to the electronic switch being switched to a conductive state.

A method as exemplified herein may comprise supplying low-voltage circuitry (for instance, LV) a from a high-voltage source (for instance, BR, Cin) by:
  coupling intermediate the high-voltage source and the low-voltage circuitry an electronic switch (for instance, MBP) having a current flow path (for instance, S, D) therethrough and a control node (for instance, G),
  switching the electronic switch to a conductive state via the control node thereof to couple the low-voltage circuitry to the high-voltage source,
  coupling a voltage-sensing node to the high-voltage source via a pull-up resistor (for instance, RHV),
  providing a further electronic switch (for instance, SW1) intermediate the voltage-sensing node and the control node of the electronic switch,
  switching (for instance, SW1_ON) the further electronic switch to a conductive state to couple the voltage-sensing node and the control node of the electronic switch in response to the voltage at said voltage-sensing node reaching a threshold (for instance, VTH), and
  providing a charge pump (for instance, 106) coupled to the current flow-path of the electronic switch, and
  activating the charge pump with the further electronic switch switched to the conductive state to pump electric charge (for instance, $I_{GATE}$) from the current flow-path of the electronic switch to the control node of the electronic switch via the further electronic switch (SW1) switched to the conductive state.

Without prejudice to the underlying principles, the details and embodiments may vary, even significantly, with respect to what has been described by way of example only without departing from the extent of protection.

A circuit (10) may be summarized as including: an electronic switch (MBP) having a current flow path (S, D) therethrough, the electronic switch (MBP) configured to be coupled intermediate a high-voltage node (VHVIN) and low-voltage circuitry (LV), the electronic switch (MBP) having a control node (G) configured to switch the electronic switch (MBP) to a conductive state wherein the low-voltage circuitry (LV) is coupled to the high-voltage node (VHVIN), a voltage-sensing node (HV) configured to be coupled to the high-voltage node (VHVIN) via a pull-up resistor (RHV), a further electronic switch (SW1) intermediate the voltage-sensing node (HV) and the control node (G) of the electronic switch (MBP), the further electronic switch (SW1) switchable to a conductive state to couple the voltage-sensing node (HV) and the control node (G) of the electronic switch (MBP) in response to a switch-on signal (SW1_ON) being asserted, a comparator (102) coupled to the voltage-sensing node (HV) and a threshold (VTH), the comparator (102) configured to compare a voltage at said voltage-sensing node (HV) with the threshold (VTH) and cause (104) the switch-on signal (SW1_ON) to be asserted in response to the voltage at said voltage-sensing node (HV) reaching said threshold (VTH), and a charge pump (106) coupled to the current flow-path of the electronic switch (MBP) and configured to be activated with the further electronic switch (SW1) switched to the conductive state to pump electric charge ($I_{GATE}$) from the current flow-path of the electronic switch (MBP) to the control node (G) of the electronic switch (MBP) via the further electronic switch (SW1) switched to the conductive state.

The circuit (10) may include a charge capacitor (CHV) coupled (HV) to the charge pump (106) to be charged thereby via charge in excess of the charge ($I_{GATE}$) pumped to the control node (G) of the electronic switch (MBP).

The charge pump (106) may be coupled to the voltage-sensing node (HV) and configured to pump therein charge sourced from the current flow-path of the electronic switch (MBP).

The circuit (10) may include a latch circuit (104) intermediate the comparator (102) and the further electronic switch (SW1) to latch therein said switch-on signal (SW1_ON) in response to the voltage at said voltage-sensing node (HV) reaching said threshold (VTH). The voltage-sensing node (HV) may be configured to be coupled to the high-voltage node (VHVIN) intermediate said pull-up resistor (RHV) and a voltage clamp (DZ) referred to ground (GND) configured to clamp to a limit value the voltage at the voltage-sensing node (HV). The electronic switch (MBP) may have a first node (D) configured to be coupled to the high-voltage node (VHVIN) and a second node (S) configured to be coupled to the low-voltage circuitry (LV), and wherein the charge pump (106) may be coupled to the current flow-path of the electronic switch (MBP) at the second node (S). The electronic switch (MBP) and the further electronic switch (SW1) may include field-effect transistors, preferably MOSFET transistors.

A power supply system may be summarized as including: a high-voltage source (BR, Cin), a circuit (10) described above having said high-voltage node (VHVIN) coupled to the high-voltage source (BR, Cin), and low-voltage circuitry (LV) coupled (S) to the electronic switch (MBP) wherein the low-voltage circuitry (LV) may be coupled to the high-voltage node (VHVIN) in response to the electronic switch (MBP) being switched to a conductive state.

A method of supplying low-voltage circuitry (LV) a from a high-voltage source (BR, Cin) may be summarized as including: coupling intermediate the high-voltage source (VHVIN; BR, Cin) and the low-voltage circuitry (LV) an electronic switch (MBP) having a current flow path (S, D) therethrough and a control node (G), switching the electronic switch (MBP) to a conductive state via the control node (G) thereof to couple the low-voltage circuitry (LV) to the high-voltage source (VHVIN; BR, Cin), coupling a voltage-sensing node (HV) to the high-voltage source (VHVIN; BR, Cin) via a pull-up resistor (RHV), providing a further electronic switch (SW1) intermediate the voltage-sensing node (HV) and the control node (G) of the electronic switch (MBP), switching (SW1_ON) the further electronic switch (SW1) to a conductive state to couple the voltage-sensing node (HV) and the control node (G) of the electronic switch (MBP) in response to the voltage at said voltage-sensing node (HV) reaching a threshold (VTH), and providing a charge pump (106) coupled to the current flow-path of the electronic switch (MBP), and activating the charge pump (106) with the further electronic switch (SW1) switched to the conductive state to pump electric charge ($I_{GATE}$) from the current flow-path of the electronic switch (MBP) to the control node (G) of the electronic switch (MBP) via the further electronic switch (SW1) switched to the conductive state.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
a high-voltage node;
low-voltage circuitry;
a first electronic switch having a current flow path, the first electronic switch configured to be coupled between the high-voltage node and the low-voltage circuitry;
a voltage-sensing node coupled to the high-voltage node;
a second electronic switch coupled between the voltage-sensing node and the first electronic switch;
a comparator coupled to the voltage-sensing node; and
a charge pump coupled to the current flow path of the first electronic switch.

2. The circuit of claim 1, wherein:
the first electronic switch has a control node that when in a conductive state is configured to couple the low-voltage circuitry to the high-voltage node;
the second electronic switch that when in a conductive state is configured to couple the voltage-sensing node to the control node of the first electronic switch in response.

3. The circuit of claim 2 wherein the second electronic switch is configured to receive a switch-on signal and the comparator is configured to compare a voltage at the voltage-sensing node with a threshold and generate the switch-on signal in response to the voltage at the voltage-sensing node reaching the threshold.

4. The circuit of claim 3 wherein the charge pump is configured to be activated with the second electronic switch when in the conductive state, the charge pump configured to move charge from the current flow path of the first electronic switch to the control node of the first electronic switch via the second electronic switch being in the conductive state.

5. The circuit of claim 4 comprising a charge capacitor coupled to the charge pump, the charge capacitor configured to be charged by the charge pump via charge in excess of the charge pumped to the control node of the first electronic switch.

6. The circuit of claim 5, comprising a latch circuit coupled between the comparator and the second electronic switch, the latch circuit configured to latch the switch-on signal in response to the voltage reaching the threshold.

7. The circuit of claim 5, further comprising a voltage clamp coupled between a ground node and the voltage-sensing node, wherein the voltage clamp is configured to clamp to a limit value of the voltage at the voltage-sensing node.

8. A power supply system, comprising:
a high-voltage source;
low-voltage circuitry; and
a circuit, including:
a first electronic switch coupled between the high-voltage source and the low-voltage circuitry;
a second electronic switch coupled between the voltage-sensing node and the first electronic switch;
a comparator coupled to the voltage-sensing node, the comparator configured to compare a voltage at the voltage-sensing node with a threshold and generate a switch-on signal in response to the voltage reaching said the threshold; and a charge pump coupled to the first electronic switch and the second electronic switch.

9. The power supply system of claim 8 wherein the charge pump is configured to move charge from a current flow path of the first electronic switch to a control node of the first electronic switch in response to the second electronic switch in the conductive state, the system comprising a charge capacitor coupled to the charge pump, the charge capacitor configured to be charged by the charge pump via charge in excess of the charge pumped to the control node of the first electronic switch.

10. The power supply system of claim 9, wherein the charge pump is coupled to the voltage-sensing node and configured to pump charge sourced from the current flow path of the first electronic switch to the voltage-sensing node.

11. The power supply system of claim 9, wherein the first electronic switch has a first node configured to be coupled to the high-voltage node and a second node configured to be coupled to the low-voltage circuitry, and wherein the charge pump is coupled to the current flow path of the first electronic switch at the second node.

12. The power supply system of claim 8, comprising a latch circuit coupled between the comparator and the second electronic switch, the latch circuit configured to latch the switch-on signal in response to the voltage at the voltage-sensing node reaching the threshold.

13. The power supply system of claim 8, further comprising a voltage clamp coupled between a ground node and the voltage-sensing node, wherein the voltage clamp is configured to clamp to a limit value of the voltage at the voltage-sensing node.

14. The power supply system of claim 8, wherein the first electronic switch and the second electronic switch are MOSFET transistors.

15. A method, comprising:
coupling low-voltage circuitry to high-voltage source by switching a first electronic switch to a conductive state;
coupling a second electronic switch between a voltage-sensing node and the first electronic switch;
coupling the voltage-sensing node to the first electronic switch by switching the second electronic switch to a conductive state in response to a voltage at the voltage-sensing node reaching a threshold;
moving electric charge from a current flow path of the first electronic switch to a control node of the first electronic switch by activating a charge pump with the second electronic switch after switching the second electronic switch to the conductive state.

16. The method of claim 15, comprising:
charging a charge capacitor by the charge pump with charge in excess of the charge pumped to the control node of the first electronic switch.

17. The method of claim 15, comprising:
pumping, by the charge pump, charge sourced from the current flow path of the first electronic switch to the voltage-sensing node.

18. The method of claim 15, comprising:
latching, by a latch circuit coupled between a comparator and the second electronic switch, a switch-on signal in response to the voltage at the voltage-sensing node reaching the threshold.

19. The method of claim 15, comprising:
clamping, by a voltage clamp coupled between a ground node and the voltage-sensing node, the voltage at the voltage-sensing node to a limit value.

20. The method of claim 15, comprising:
coupling a first node of the first electronic switch to a high-voltage node;
coupling a second node of the first electronic switch to the low-voltage circuitry; and
coupling the charge pump to the current flow path of the first electronic switch at the second node.

\* \* \* \* \*